United States Patent
Do et al.

(10) Patent No.: US 7,968,791 B2
(45) Date of Patent: Jun. 28, 2011

(54) SOLAR ENERGY COLLECTION SYSTEM

(75) Inventors: Khiem B. Do, San Jose, CA (US); Kevin R. Langworthy, Holly, MI (US); Gianfranco Gabbianelli, Birmingham, MI (US); Eric C. Johnson, Mountain View, CA (US); Dominico P. Julian, Oakland, CA (US); Marc A. Finot, Palo Alto, CA (US); Cameron G. Wylie, San Mateo, CA (US)

(73) Assignee: Skyline Solar, Inc., Mountain View, CA (US)

( * ) Notice: Subject to any disclaimer, the term of this patent is extended or adjusted under 35 U.S.C. 154(b) by 0 days.

(21) Appl. No.: 12/846,620

(22) Filed: Jul. 29, 2010

(65) Prior Publication Data
US 2011/0023940 A1 Feb. 3, 2011

Related U.S. Application Data

(60) Provisional application No. 61/229,905, filed on Jul. 30, 2009, provisional application No. 61/362,591, filed on Jul. 8, 2010.

(51) Int. Cl.
| | |
|---|---|
| H02N 6/00 | (2006.01) |
| H01L 31/042 | (2006.01) |
| F24J 2/38 | (2006.01) |
| F24J 2/12 | (2006.01) |
| F24J 2/10 | (2006.01) |
| G01C 21/02 | (2006.01) |
| G01C 21/24 | (2006.01) |
| G01J 1/20 | (2006.01) |

(52) U.S. Cl. ........ 136/246; 126/576; 126/694; 126/696; 250/203.4

(58) Field of Classification Search .................... 13/244, 13/246; 126/569, 572, 573, 576, 684, 692, 126/694, 696; 260/203.4; 250/203.4
See application file for complete search history.

(56) References Cited

U.S. PATENT DOCUMENTS 1,830,375 A 11/1931 Shoop
(Continued)

FOREIGN PATENT DOCUMENTS

DE 20314372 1/2004
(Continued)

OTHER PUBLICATIONS

GSS Slew Drive, a product schematic from Sunflower Energy Inc.*
(Continued)

*Primary Examiner* — Jennifer K. Michener
*Assistant Examiner* — Eli S Mekhlin
(74) *Attorney, Agent, or Firm* — Beyer Law Group LLP

(57) ABSTRACT

In one aspect of the present invention, a solar energy collection system that includes multiple longitudinally adjacent collectors is described. The collectors are coupled end to end to form a collector row. The collector row extends along a longitudinal axis and is arranged to rotate about a pivot axis to track the sun in at least one dimension. Each collector includes a reflector, one or more solar receivers and a support structure. The support structure includes a tube assembly that underlies the reflector. The tube assemblies of the collector row are arranged end to end along the longitudinal axis. There is a space between the tube assemblies of adjacent collectors in the collector row, where the reflectors of the adjacent collectors extend beyond the underlying tube assemblies to form a substantially continuous reflective surface over the space. A coupling device is positioned in the space between the tube assemblies. The coupling device connects and helps to rotate the tube assemblies of the adjacent collectors. Some embodiments relate to various types of coupling devices and collector arrangements.

14 Claims, 6 Drawing Sheets

U.S. PATENT DOCUMENTS

| | | | |
|---|---|---|---|
| 3,760,624 A | 9/1973 | Robinson | |
| 4,135,493 A * | 1/1979 | Kennedy | 126/577 |
| 4,148,298 A * | 4/1979 | Sherman, Jr. | 126/685 |
| 4,243,019 A | 1/1981 | Severson | |
| 4,243,301 A | 1/1981 | Powell | |
| 4,249,431 A * | 2/1981 | Pruvot et al. | 475/345 |
| 4,257,403 A * | 3/1981 | Chevalier | 126/675 |
| 4,306,540 A * | 12/1981 | Hutchison | 126/607 |
| 4,335,708 A * | 6/1982 | Holter et al. | 126/676 |
| 4,337,758 A | 7/1982 | Meinel et al. | |
| 4,348,798 A | 9/1982 | Hutchison | |
| 4,422,614 A | 12/1983 | Santos | |
| 4,423,719 A | 1/1984 | Hutchison | |
| 4,432,343 A * | 2/1984 | Riise et al. | 126/602 |
| 4,528,977 A | 7/1985 | Malley | |
| 4,571,812 A | 2/1986 | Gee | |
| 4,583,520 A | 4/1986 | Dietrich et al. | |
| 4,611,575 A | 9/1986 | Powell | |
| 5,038,858 A | 8/1991 | Jordan et al. | |
| 5,058,565 A | 10/1991 | Gee et al. | |
| 5,288,337 A | 2/1994 | Mitchell | |
| 5,538,563 A | 7/1996 | Finkl | |
| 5,722,145 A | 3/1998 | Haushalter et al. | |
| 5,771,966 A | 6/1998 | Jacoby | |
| 5,961,739 A | 10/1999 | Osborne | |
| 6,020,554 A | 2/2000 | Kaminar et al. | |
| 6,035,850 A | 3/2000 | Deidewig | |
| 6,260,610 B1 | 7/2001 | Biber et al. | |
| 6,276,359 B1 | 8/2001 | Frazier | |
| 6,399,874 B1 | 6/2002 | Olah | |
| 6,401,807 B1 | 6/2002 | Wyler et al. | |
| 6,508,301 B2 | 1/2003 | Marsala | |
| 6,615,909 B2 | 9/2003 | Fast | |
| 6,861,293 B2 | 3/2005 | Soule | |
| 6,870,087 B1 | 3/2005 | Gallagher | |
| 6,978,827 B2 | 12/2005 | Armstrong | |
| 6,994,082 B2 | 2/2006 | Hochberg et al. | |
| 7,065,873 B2 | 6/2006 | Kang et al. | |
| 2004/0261786 A1 | 12/2004 | Kirk | |
| 2006/0225730 A1 | 10/2006 | Anderson | |
| 2006/0266407 A1 | 11/2006 | Lichy et al. | |
| 2007/0089777 A1 | 4/2007 | Johnson, Jr. et al. | |
| 2007/0144578 A1 | 6/2007 | Cunningham et al. | |
| 2007/0272295 A1 | 11/2007 | Rubin et al. | |
| 2008/0134497 A1 | 6/2008 | Corrales et al. | |
| 2008/0135085 A1 | 6/2008 | Corrales et al. | |
| 2008/0135086 A1 | 6/2008 | Corrales | |
| 2008/0142319 A1 | 6/2008 | Manter | |
| 2008/0308091 A1 * | 12/2008 | Corio | 126/606 |
| 2009/0056698 A1 | 3/2009 | Johnson et al. | |
| 2009/0056785 A1 | 3/2009 | Johnson et al. | |
| 2009/0056786 A1 | 3/2009 | Johnson et al. | |
| 2009/0056787 A1 | 3/2009 | Johnson et al. | |

FOREIGN PATENT DOCUMENTS

| | | |
|---|---|---|
| JP | 53-131781 | 11/1978 |
| WO | WO 01/63665 | 8/2001 |
| WO | WO 03/098705 | 11/2003 |
| WO | WO 2004/114419 | 12/2004 |
| WO | WO 2005/006435 | 1/2005 |
| WO | WO 2006/083742 | 8/2006 |
| WO | WO 2008/013976 | 1/2008 |

OTHER PUBLICATIONS

International Search Report dated Apr. 16, 2009 in PCT Application No. PCT/US2008/075250.

Written Opinion dated Apr. 16, 2009 in PCT Application No. PCT/US2008/075250.

International Search Report in PCT Application No. PCT/US2008/075247 dated Nov. 30, 2009.

Written Opinion in PCT Application No. PCT/US2008/075247 dated Nov. 30, 2009.

International Preliminary Report on Patentability in PCT Application No. PCT/US2008/075250 dated Dec. 7, 2009.

International Preliminary Report on Patentability in PCT Application No. PCT/US2008/075247 dated Jan. 21, 2010.

Robinson Fin website: http://www.robfin.com/portals/0/R600006%20ruffled%20Model%20(1) downloaded on Apr. 17, 2009.

U.S. Appl. No. 29/324,036, filed Sep. 4, 2008.

"Continuing Testing Materials and Concepts," Solar20, www.solar20.com/SE/EN/1210-EN_prototype2.php, 2003 (1 page).

"Harmony 11.5 kW Solar Cogeneration," HelioDynamics, Product datasheet (2 pages).

"Industrial Solar Engery," Menova Energy Inc., 2006 (5 pages).

"Solar Power for a Sustainable World," Abengoa Solar IST, www.solucar.es/sotes/solar/en/tec_ccp.jsp, printed from online Apr. 15, 2008 (4 pages).

Alarte et al. "Design, Construction and Measurement of a Single-Minor Two-Stage (SMTS) Photovoltaic Concentrator." $2^{nd}$ World Conference and Exhibition on Photovoltaic Solar Energy Conversion, Vienna, Austria, Jul. 6-10, 1998.

Database WPI Week 200735, Thomson Scientific, London, GB; AN 2007-370318, XP002512878 & RU 2300058C2 abstract.

Invitation to Pay Additional Fees in PCT Application No. PCT/US2008/075250 dated Feb. 10, 2009.

Mohedano et al., "Design of a Simple Structure for the D-SMTS Concentrator," 16th European Photovoltaic Solar Energy Conference, Glasgow, UK 2000, pp. 2563-2566.

Mohedano et al., "Design, Construction and Measurement of a Dielectric-Single Mirror Two Stage (DSMTS) Photovoltaic Concentrator," *Proc. Of the SPIE*, 4446, 2002, pp. 20-31.

Partial International Search Report dated Feb. 11, 2009 in PCT Application No. PCT/US2008/075247.

Sala et al., "480 kWpeak Euclides™ Concentrator Power Plant Using Parabolic Troughs," Springer Berlin / Heidelberg, ISSN 0342-4111, 2007 (6 pages).

Sala et al., "The 480 kWp EUCLIDES™—Thermie Power Plant: Installation, Set-Up and First Results," (6 pages).

Smeltink et al., "40kW PV Thermal Roof Mounted Concentrator System," Energy Conversion, Conference Record of the 2006 IEEE 4th World Conference on vol. 1, May 2006 (4 pages).

Smeltink et al., "The ANU 20kW PV/Trough Concentration," Conference paper, 1999 (4 pages).

Wenham et al., "Applied Photovoltaics" Second Edition, Earthscan, ISBN-10:18-4407-401-3, 2007 (7 pages).

Whitefield et al. "The Development and Testing of Small Concetrating PV Systems." Solar Energy, Pergamon Press. Oxford, GB, vol. 67, No. 1-3, pp. 23-34, Jul. 1, 1999.

Winston et al., "Nonimaging Optics," Elsevier Academic Press, ISBN-13:978-0-12-759751-5, 2005 (10 pages).

Notice of Allowance dated Mar. 26, 2010 from U.S. Appl. No. 12/100,726.

International Search Report dated Mar. 29, 2011 in PCT Application No. PCT/US2010/043763.

Written Opinion dated Mar. 29, 2011 in PCT Application No. PCT/US2010/043763.

* cited by examiner

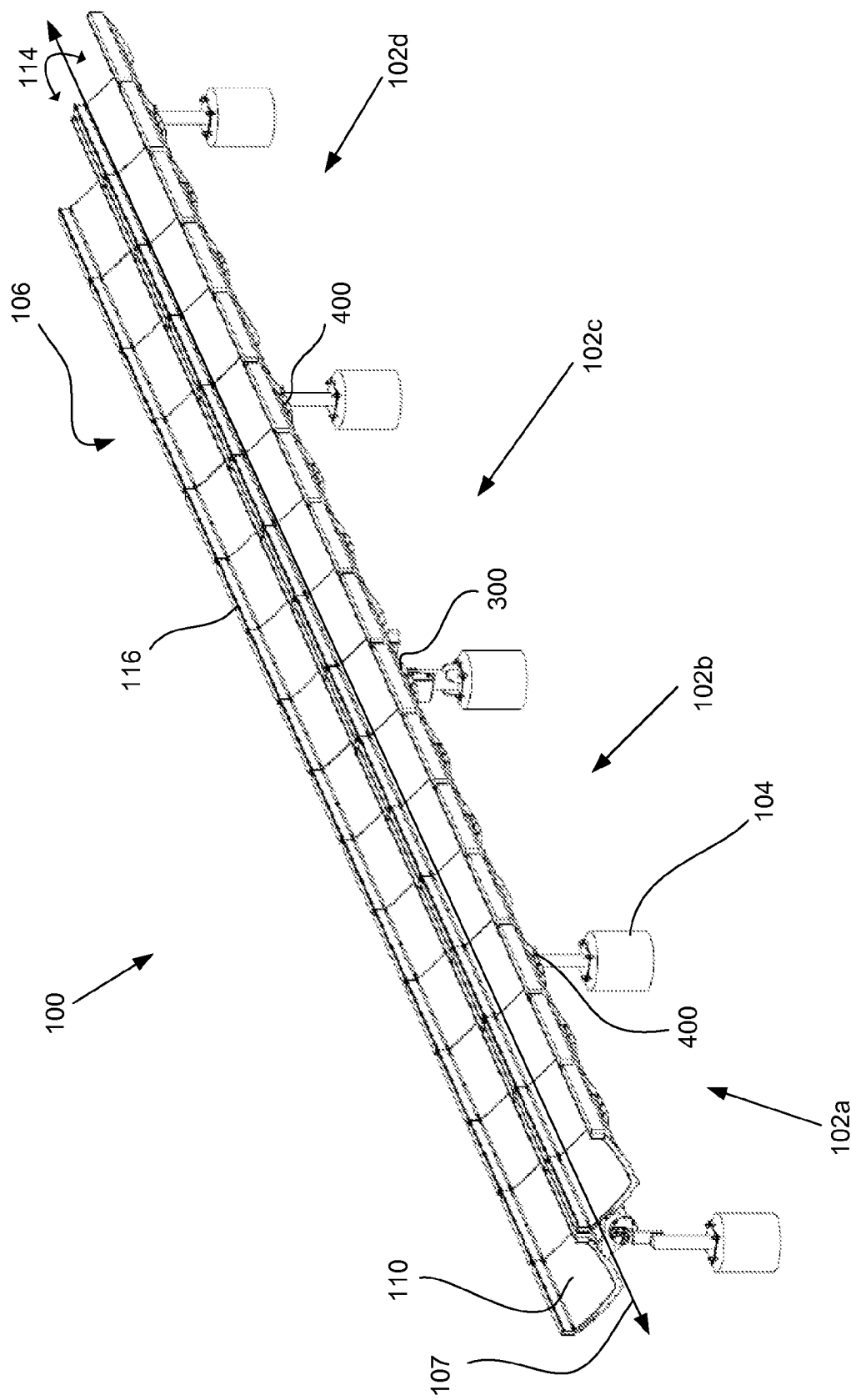

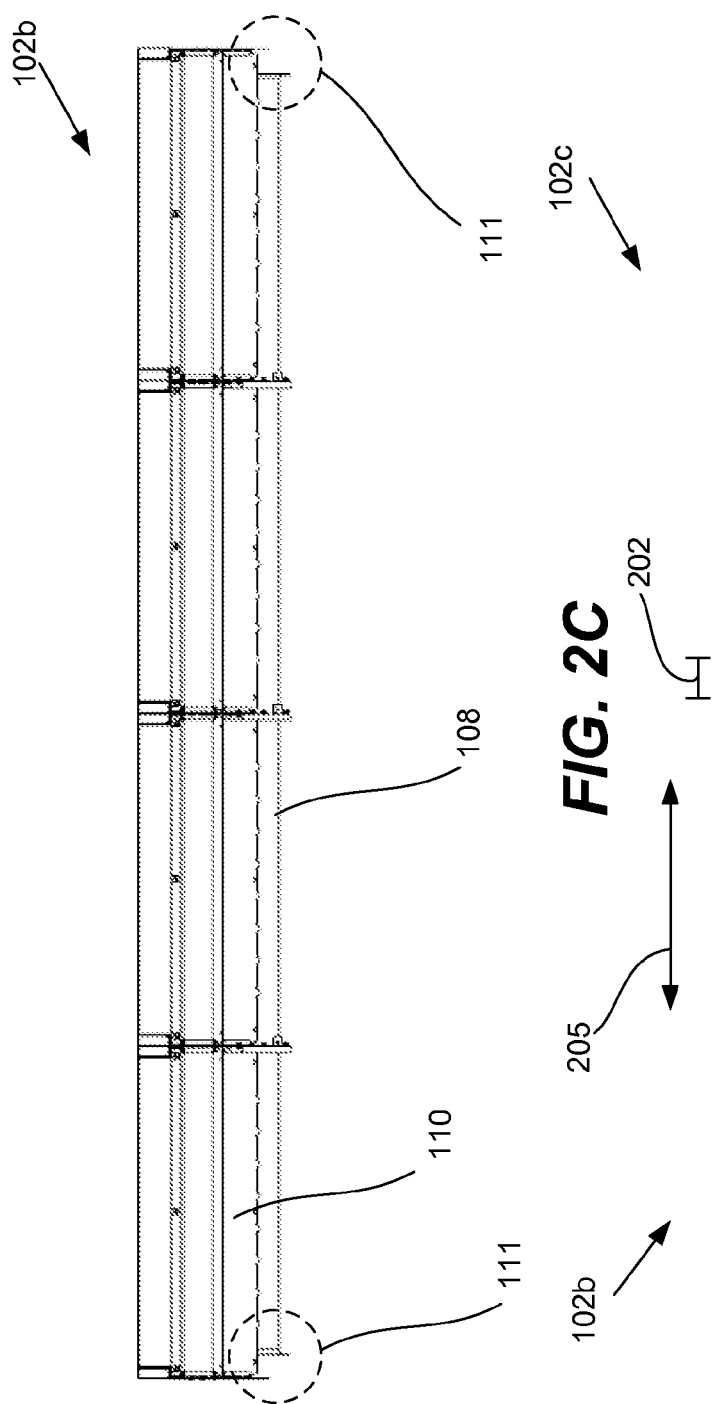
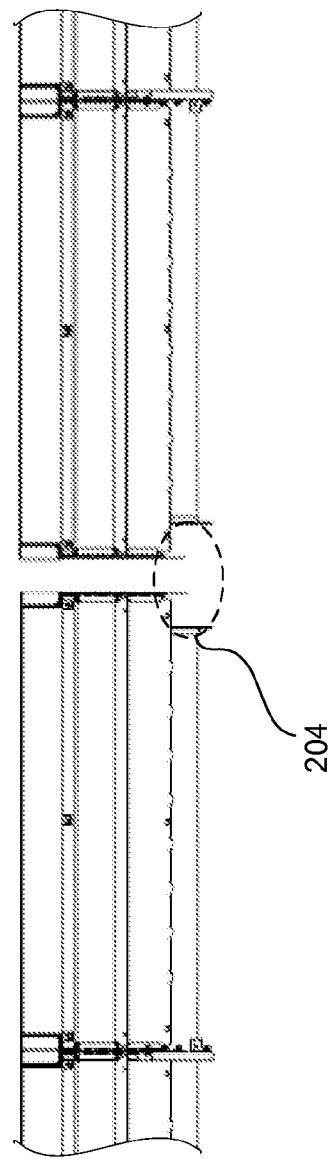
FIG. 2C
FIG. 2D

SOLAR ENERGY COLLECTION SYSTEM

CROSS-REFERENCE TO RELATED APPLICATIONS

This application claims priority to Provisional Patent Application No. 61/229,905, filed Jul. 30, 2009, entitled "Manufacturable Dual Trough Solar Collector," and Provisional Patent Application No. 61/362,591, entitled "Optimized Solar Collector," filed on Jul. 8, 2010, which are incorporated herein in their entirety for all purposes.

FIELD OF THE INVENTION

Generally, the present invention relates generally to solar energy collection systems. More specifically, the present application relates to solar collectors and solar collector arrangements for use in concentrating photovoltaic systems.

BACKGROUND OF THE INVENTION

Typically, the most expensive component of a photovoltaic (PV) solar collection system is the photovoltaic cell. To help conserve photovoltaic material, concentrating photovoltaic (CPV) systems use minors or lenses to concentrate solar radiation on a smaller cell area. Since the material used to make the optical concentrator is less expensive than the material used to make the cells, CPV systems are thought to be more cost-effective than conventional PV systems.

One of the design challenges for any CPV system is the need to balance multiple priorities. For one, a CPV system requires a support structure that arranges the optical concentrators and the photovoltaic cells such that incoming sunlight is properly received and focused. This support structure should also accommodate a tracking system and provide for the adequate dissipation of heat. Another consideration is the cost of manufacturing, installing and repairing the CPV system. Existing CPV designs address these issues in a wide variety of ways. Although existing CPV systems work well, there are continuing efforts to improve the performance, efficiency and reliability of CPV systems.

SUMMARY OF THE INVENTION

In one aspect of the present invention, a solar energy collection system that includes multiple longitudinally adjacent collectors is described. The collectors are coupled end to end to form a collector row. The collector row extends along a longitudinal axis and is arranged to rotate about a pivot axis to track the sun in at least one dimension. Each collector includes a reflector, one or more solar receivers and a support structure. The support structure includes a tube assembly that underlies the reflector. The tube assemblies of the collector row are arranged end to end along the longitudinal axis. There is a space between the tube assemblies of adjacent collectors in the collector row, where the reflectors of the adjacent collectors extend beyond the underlying tube assemblies to form a substantially continuous reflective surface over the space. A coupling device is positioned in the space between the tube assemblies. The coupling device connects and helps to rotate the tube assemblies of the adjacent collectors.

In some implementations, the gap between adjacent reflectors is minimal e.g., less than approximately 10 or 15 millimeters. A minimal gap helps the adjacent reflectors cooperate to form a substantially continuous flux line on the receivers of the associated collectors. In some designs, the gap is covered at least in part by a reflective splice that helps further reduce or eliminate discontinuity in the flux line.

In another embodiment of the present invention, a solar energy collection system that includes at least two longitudinally adjacent collectors and a drive coupling device will be described. The two adjacent collectors are connected with one another using the drive coupling device to form at least a portion of a collector row. The drive coupling device includes a motor that applies rotational torque to help rotate the reflectors of the adjacent collectors. The motor is attached in manner such that it rotates together with the reflectors of the adjacent collectors.

Various designs involve a collector row that includes additional collectors that extend the collector row in a longitudinal direction. In particular embodiments, these additional collectors may be coupled together using non-drive coupling devices. The non-drive coupling devices are arranged to transfer rotational torque between adjacent collectors. In some implementations, the motive force for tilting the entire collector row originates from a single drive coupling device at the center of the collector row. The rotational torque is then transferred throughout the collector row via the non-drive coupling devices.

BRIEF DESCRIPTION OF THE DRAWINGS

The invention and the advantages thereof, may best be understood by reference to the following description taken in conjunction with the accompanying drawings in which:

FIG. 1 is a perspective view of a solar energy collection system according to a particular embodiment of the present invention.

FIGS. 2A-2C are perspective, cross-sectional and side views of a solar collector according to a particular embodiment of the present invention.

FIG. 2D is a side view of two adjacent solar collector according to a particular embodiment of the present invention.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

Figure 2A:
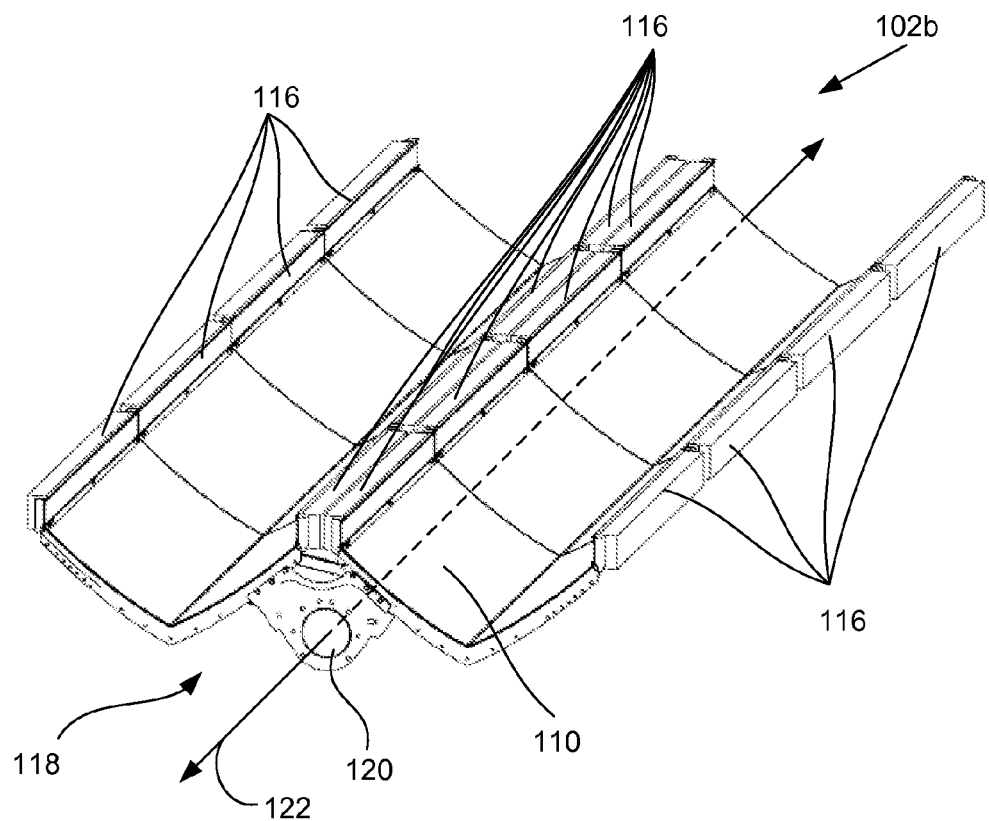

The present invention relates generally to solar energy collection. Some aspects of the invention relate to solar collectors, arrangements of multiple solar collectors, and devices for tracking the sun. It should be appreciated that additional embodiments, features and drawings related to the present application are described in Provisional Application No. 61/229,905, filed Jul. 30, 2009, entitled "Manufacturable Dual Trough Solar Collector," which is incorporated herein in its entirety for all purposes.

Referring now to FIG. 1, a solar energy collection system 100 according to one embodiment of the present invention will be described. Solar energy collection system 100 includes multiple solar collectors 102a-102d that are coupled end to end along a longitudinal axis 107 to form a solar collector row 106. Each solar collector includes a reflector 110 that is arranged to direct incident sunlight towards the solar receivers 116. The solar energy collection system 100 is arranged to pivot the solar collector row 106 around a pivot axis in order to track the movements of the sun. Multiple mounting posts 104 support the solar collector row 106.

The collectors 102a-102d are arranged side by side along the longitudinal axis 107 such that there is a minimal gap between the reflectors 110 of adjacent collectors. Light reflected from the reflectors 110 thus forms a substantially continuous flux line on the photovoltaic (PV) cells of the solar receivers 116. This results in a more uniform distribution of light across the PV cells and helps increase their efficiency.

The solar energy collection system 100 also includes a tracking system that helps the collector row 106 track movements of the sun throughout the day. In the illustrated embodiment of FIG. 1, the collector row 106 rotates (as shown by arrow 114) around a pivot axis that extends parallel to the longitudinal axis 107. This rotation is powered by a motor in a drive coupling device 300. The rotational torque generated by the drive coupling device is transferred to the outer collectors 102a and 102d via additional non-drive coupling devices 400. The coupling devices 300 and 400 are positioned in spaces between the support structures of adjacent collectors. The reflectors 110 of the adjacent collectors extend over these spaces to form a substantially continuous reflective surface.

Figure 2B:
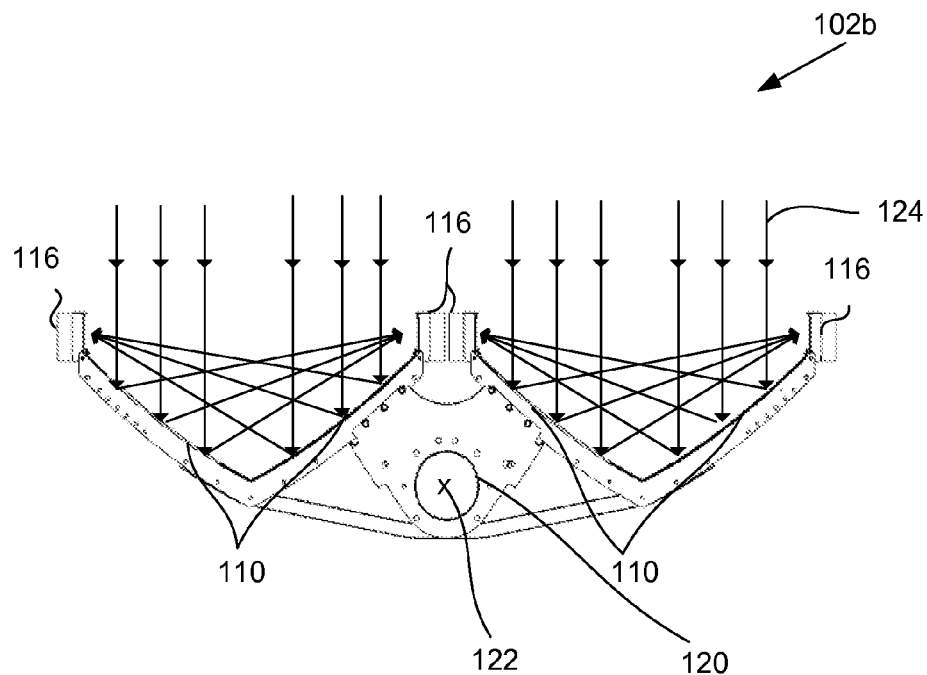

Referring now to FIGS. 2A and 2B, perspective and cross-sectional views of the collector 102b according to particular embodiment of the present invention will be described. The collector 102b includes a reflector 110, one or more solar receivers 116, and a support structure 118, which includes a tube assembly 120. The solar receivers 116 include one or more strings of photovoltaic cells. It should be appreciated that the present invention is not intended to be limited to the collectors illustrated in this application. By way of example, any of the solar collector designs, receiver designs and features described in U.S. Pat. No. 7,709,730, entitled "Dual Trough Concentrating Solar Photovoltaic Module," filed on Apr. 10, 2008, and Provisional Patent Application No. 61/362,591, entitled "Optimized Solar Collector," filed on Jul. 8, 2010, which are both incorporated herein by reference for all purposes, may be used with the present invention.

The tube assembly 120 is any structure that is arranged to help support and rotate the reflectors 110 (e.g., a cylinder, a beam, a rod, associated braces, brackets, etc.). In some implementations, the tube assembly 120 is arranged to rotate around a pivot axis 122, which in turn causes the attached reflectors 110 and receivers 116 to tilt. When the reflectors 110 are appropriately oriented towards the incident sunlight 124, the reflectors 110 reflect the sunlight to form a flux line on the receivers 116. A diagrammatic illustration of how the sunlight may be reflected is provided in FIG. 2B.

Referring now to FIGS. 2C and 2D, a side view of collectors 102b-102c of FIG. 1 according to a particular embodiment of the present invention will be described. FIG. 2C illustrates a side view of a single collector 102b, while FIG. 2D illustrates a region where the collectors 102b-102c are adjacent to one another. As discussed previously, the collectors 102b-102c are arranged such that only a minimal gap 202 exists between their respective reflectors 110. (It should be noted that the size of the gap 202 in FIG. 2D has been enlarged for the sake of clarity and is not to scale.) That is, the reflectors 110 of the adjacent collectors 102b-102c form a substantially continuous reflective surface. Incident sunlight that is reflected off of this surface forms a substantially continuous flux line on the solar receivers 116 of FIG. 1.

The support structures underlying the reflectors 110 are arranged to accommodate a coupling device that helps connect the collectors 102b-102c together. More specifically, the end of the tube assembly 108 of each collector 102b-102c does not extend as far as the end of its overlying reflector 110. As a result, an indentation 111 is formed at the end of each collector. When the ends of the collectors 102b and 102c are positioned adjacent to one another, their respective indentations 111 cooperate to form a space 204 between the tube assemblies 108. The reflectors 110 form a substantially continuous reflective surface over this space 204 between the tube assemblies 108. In various implementations, a coupling device (e.g., drive coupling device 300 of FIG. 3A, non-drive coupling device 400 of FIG. 4A, etc.) is positioned within this space to help connect the tube assemblies, as will be discussed in greater detail below.

The small gap 202 between the reflectors of adjacent collectors may vary in size. In some embodiments, for example, the width of the gap 202 is less than approximately 10 or 15 millimeters. A gap size of between approximately 5 and 15 millimeters works well for various applications. Preferably, the size of the gap 202 should be quite small relative to the width of the photovoltaic cells used in the receivers of the collector row. This helps ensure that there are no large disparities in exposure between photovoltaic cells in a string of serially connected cells. Such disparities can reduce the efficiency of the cell string. Accordingly, some designs involve a gap 202 whose width is no more than approximately 10, 20 or 30% of the width of a photovoltaic cell in the solar receiver.

In particular implementations, the gap 202 is covered with a splice (not shown) that is made of a reflective material. The splice, together with the reflectors 110 of the adjacent collectors 102b-102c, is arranged to reflect light to form a substantially continuous flux line on the cells of the receivers. To make room for thermal expansion along the length of the collector row, the splice is preferably coupled with the adjacent reflectors in a manner that allows them to move in the longitudinal direction 205.

Figure 3A:
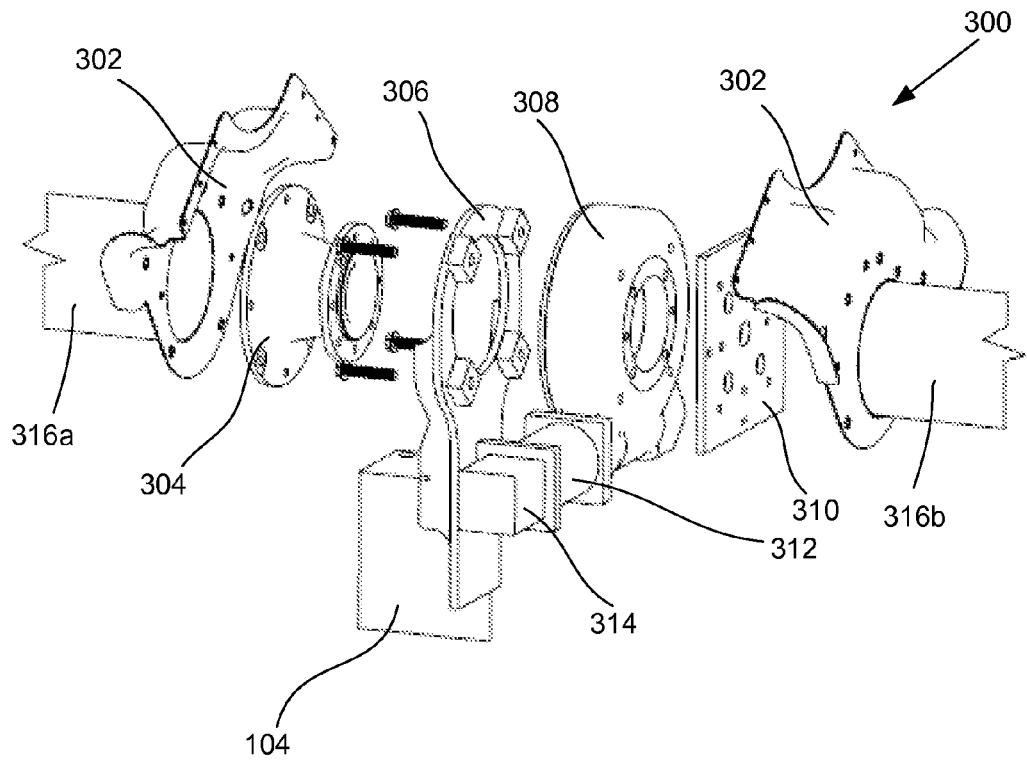
FIG. 3A is an exploded view of a drive coupling device according to a particular embodiment of the present invention.
Figure 3B:
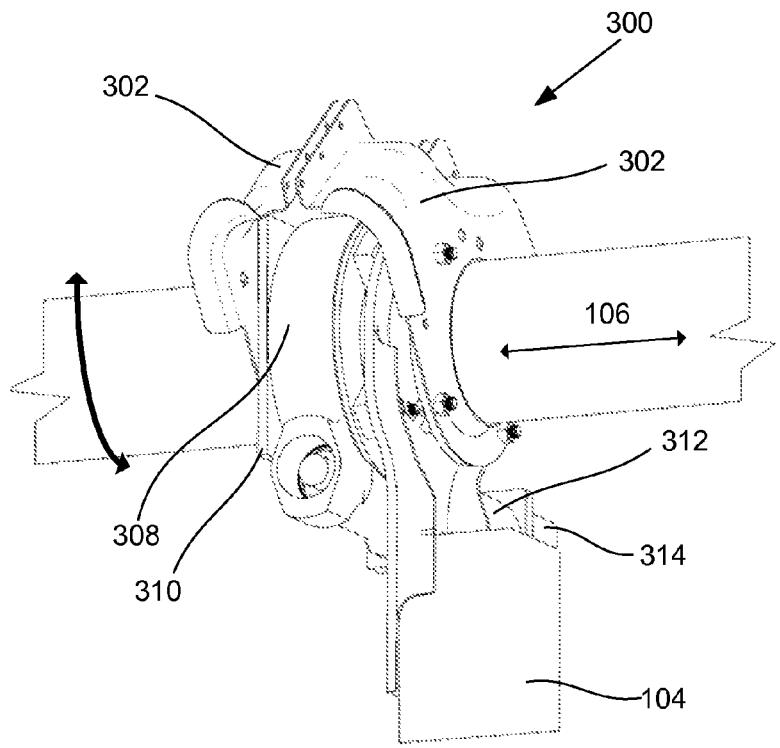
FIG. 3B is a view of an assembled drive coupling device according to a particular embodiment of the present invention.

Referring now to FIGS. 3A and 3B, perspective views of a drive coupling device 300 according to a particular embodiment of the present invention will be described. FIG. 3A provides an exploded view of the drive coupling device 300, while FIG. 3B provides a view of an assembled drive coupling device 300. Generally, the drive coupling device 300 is arranged to apply rotational torque to the adjacent solar collectors so that they properly track the movements of the sun. The drive coupling device 300 can include a wide variety of components. In the illustrated embodiment, for example, the drive coupling device 300 includes a slew drive 308, a planetary drive 312 and a motor 314. The drive coupling device 300 is positioned between tube assemblies 316a-316b of two adjacent collectors (e.g., of collectors 102b and 102c of FIGS. 1 and 2C). A mounting post 104 physically supports the drive coupling device 300.

Preferably, the drive coupling device 300 is arranged such that the motor 314 rotates in tandem with the reflectors 110.

That is, the motor 314 substantially maintains its position relative to the reflectors 110 even when the reflectors are in motion. In the illustrated embodiment, for example, the motor 314 and the planetary drive 312 are attached to a rotatable portion of the slew drive 308 and thus rotate together with any other structures that are attached therewith (e.g., the tube assembly 108, the reflectors 110, etc.) This feature conserves space underneath the reflectors and helps eliminate the need for flexible connectors to extend between the motor 314 and the slew drive 308, the reflectors 110 and/or their associated support structure.

The slew drive 308 can be any device suitable for applying rotational torque to tilt the reflectors of the adjacent collectors. In the illustrated embodiment, for example, the slew drive 308 includes a rotatable portion, which is a part of the slew drive that is capable of rotating independently from other parts of the slew drive, and a stationary portion, which is a part of the slew drive that is fixed and incapable of rotating independently from other parts of the slew drive. The rotatable portion of the slew drive 308 is coupled with the tube assemblies 316a-316b. When activated, the slew drive 308 rotates the tube assemblies and their corresponding reflectors using the motive force provided by the motor 314.

The optional planetary drive 312, which is coupled with the motor 314 and the slew drive 308, may be used to reduce the rotational speed of the motor to a speed that is appropriate for driving the collector row. By way of example, the amount of gear reduction may be approximately 10,000:01 to 20,000:1, although smaller and larger reductions are also possible. The gear reduction can increase the torque that is applied to the tube assemblies 316a and 316b so that a relatively small motor 314 can be used.

The tube assemblies 316a and 316b, the mounting post 104 and the slew drive 308 can be coupled with one another using a wide variety of structures. In the illustrated embodiment, for example, the stationary portion of the slew drive 308 is attached to a mounting support 306. The mounting post 104 underlies and supports the mounting support 306. The end of the tube assembly 316a is connected to a bracket 302, which is coupled with a coupler 304. The coupler 304 extends through an aperture in the mounting support 306 and is coupled to the rotatable portion on one side of the slew drive 308. A mounting plate 310 is coupled to the rotatable portion on the opposite side of the slew drive. The mounting plate 310 is connected to another bracket 302, which is in turn connected to the other tube assembly 316b.

The drive coupling device 300 may include various features to facilitate assembly and repair. In some embodiments, for example, some or all of the aforementioned parts of the drive coupling device 300 and the tube assemblies 316a and 316b are connected using fasteners and without welding. Additionally, some or all of these parts may include alignment features. Each alignment feature can include an alignment hole and a precision dowel that is used to hold adjacent parts in place.

The drive coupling device 300 can be positioned in any suitable location within the collector row. By way of example, the drive coupling device 300 of FIG. 1 is positioned in the center of the collector row 106 i.e., between collectors 102b and 102c. Some designs involve only one drive coupling device 300 per collector row 106. Accordingly, in FIG. 1, the rotational torque used to rotate the collector row 106 comes entirely from the single drive coupling device 300, although this is not a requirement. Additional collectors 102a and 102d are coupled to the collectors 102b and 102c, respectively, using a non-drive coupling device, which will be described in greater detail below.

Figure 4A:
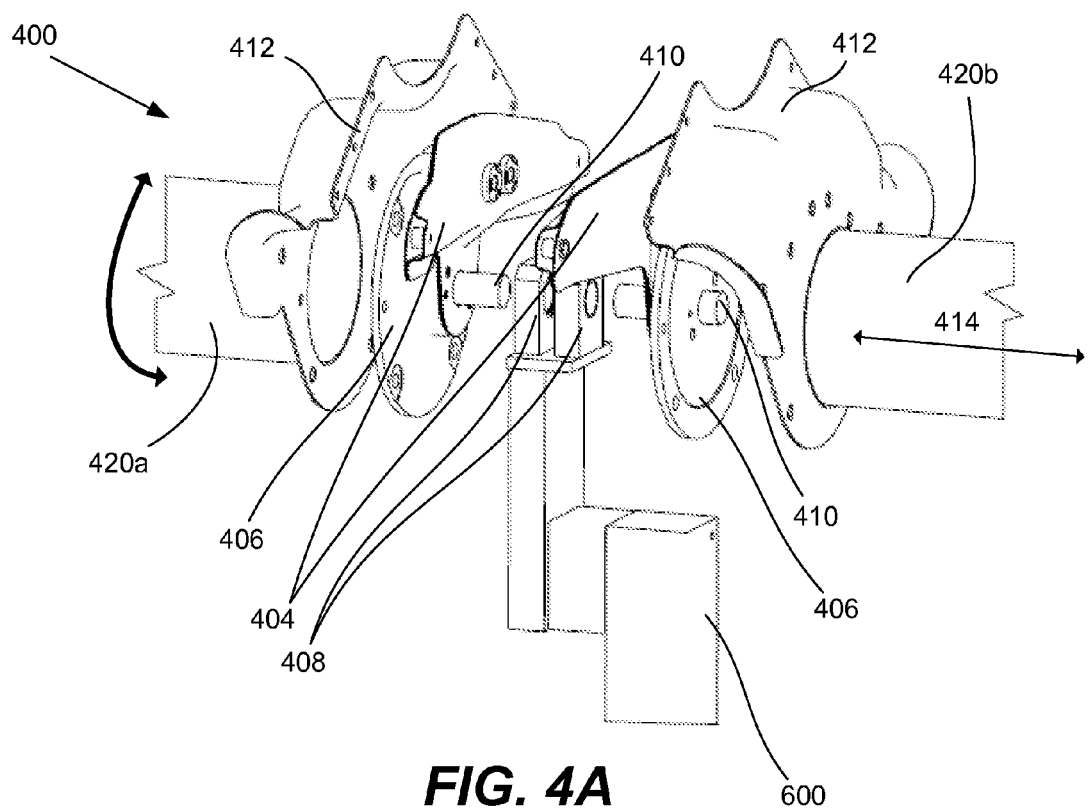
FIG. 4A is an exploded view of a non-drive coupling device according to a particular embodiment of the present invention.
Figure 4B:
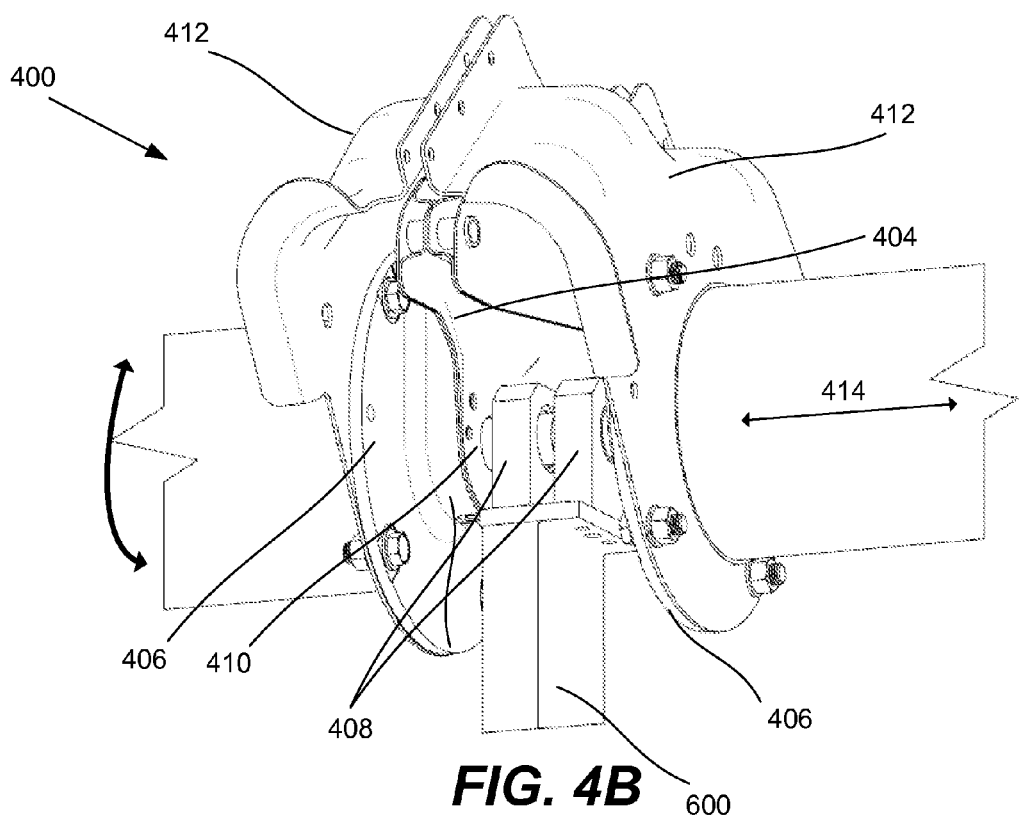
FIG. 4B is a view of an assembled non-drive coupling device according to a particular embodiment of the present invention.

Referring now to FIGS. 4A and 4B, a non-drive coupling device 400 according to one embodiment of the present invention will be described. FIG. 4A provides an exploded view of the non-drive coupling device 400, while FIG. 4B shows a view of an assembled device 400. The non-drive coupling device 400 may be any device suitable for transferring rotational torque between adjacent collectors in a collector row. In the illustrated embodiment, the non-drive coupling device 400, which includes transfer arms 404, interconnects 406 and bushing blocks 408, connects with two tube assemblies 420a-420b that underlie two adjacent collectors (e.g., collectors 102c-102d in the collector row 106 of FIG. 1.)

The non-drive coupling device 400 may connect the tube assemblies 420a-420b in a wide variety of ways. By way of example, in FIGS. 4A and 4B the bushing blocks 408 are mounted on a top end of a mounting post 600. Each tube assembly 420a-420b is attached with a bracket 412, which in turn is attached to an interconnect 406 with a protruding shaft 410. The shaft 410 is received by a hole in the bushing block 408, where the shaft 410 is generally free to rotate.

The transfer arms 404 are coupled with their respective tube assemblies 420a-420b and are attached to one another in a manner that allows for the transfer of rotational torque between the tube assemblies 420-420b. In various designs, each transfer arm 404 includes one or more flexible portions that allow the transfer arm to move along the longitudinal axis 414, while maintaining rigidity for rotation about the longitudinal axis. This allows the transfer arm 404 to help compensate for differential thermal expansion along the collector row. In the illustrated embodiment, most of the weight of the tube assemblies 420a-420b is not carried by the transfer arms 404. Instead, the weight of the tube assemblies 420a-420b is carried more by the bushing blocks 408 than by the transfer arms 404.

It should be appreciated that the various components illustrated in FIGS. 4A and 4B may be connected and supported in a wide variety of ways. For example, some or all of these components may be coupled with one another using fasteners and/or without the use of any welding. Some or all of the components may have one or more alignment features (e.g., alignment holes with precision dowels, etc.) to facilitate rapid assembly of the non-drive coupling device 400.

Figure 5:
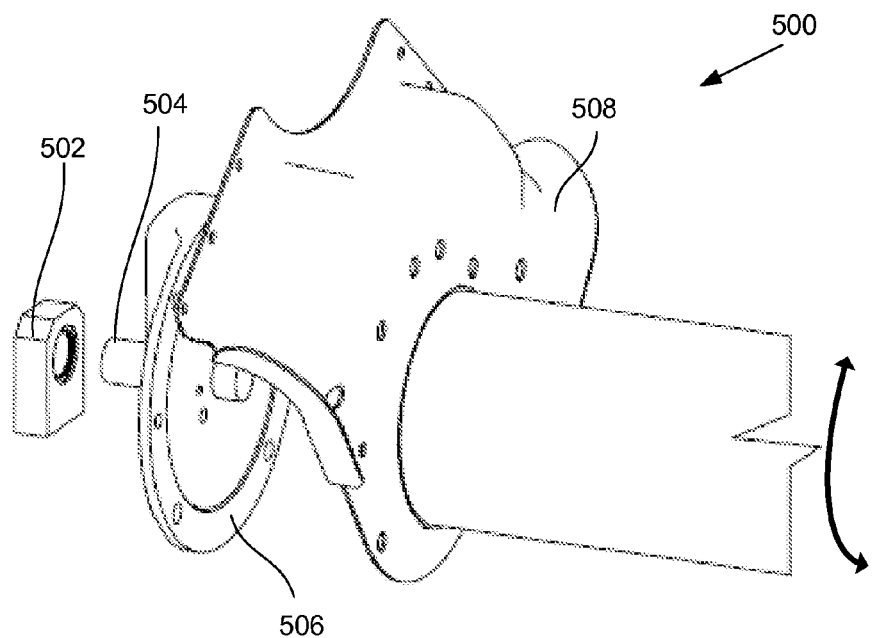
FIG. 5 is an exploded view of an end coupling device according to a particular embodiment of the present invention.

Referring next to FIG. 5, a free end coupling device 500 according to a particular embodiment of the present invention will be described. Generally, the free end coupling device may be any coupling device that is arranged to facilitate the rotation of a reflector that is positioned at the end of a collector row (e.g, collector 102a or 102d of FIG. 1.) In the illustrated embodiment, for example, the free end coupling device includes a bushing block 502 and an interconnect 506. The bushing block 502 is mounted on the top end of a mounting post (not shown). A shaft 504 extends out of an interconnect 506, which is attached to a tube assembly 510 via a bracket 508. The shaft 504 rests in a hole in the bushing block 502 and is generally arranged to rotate freely therein.

Figure 6:
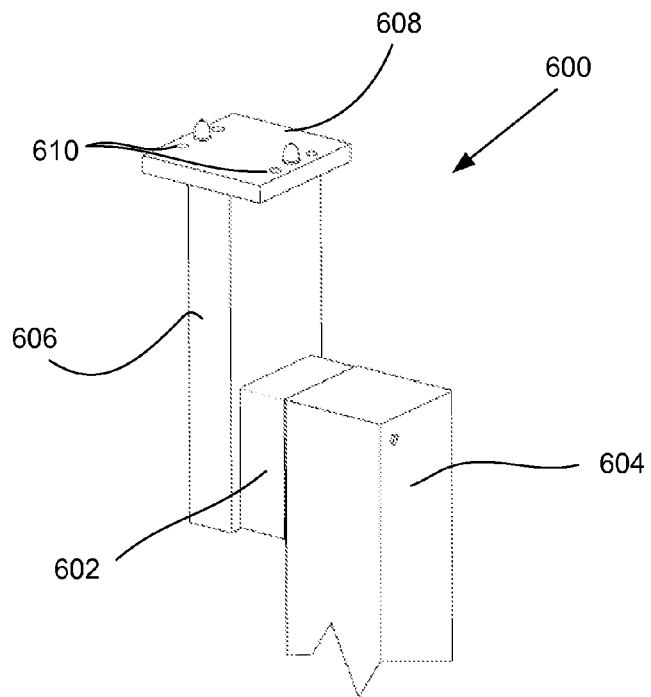
FIG. 6 is a perspective view of a mounting post with a dogleg according to a particular embodiment of the present invention.

Referring now to FIG. 6, a mounting post 600 according to a particular embodiment of the present invention will be described. The mounting post 600 is arranged to help increase the range of motion of an overlying solar collector. In the illustrated embodiment, the mounting post 600 includes a lower portion 604, an upper portion 606 and a dogleg 602. Mounted on the top end of the upper portion 606 is an attachment support 608, which is arranged to support one of the aforementioned coupling devices. By way of example, FIG. 4A illustrates a mounting post 600 that supports a non-drive coupling device 400.

The mounting post 600 is arranged to increase the tilt range of the reflectors, which can allow the reflectors to track the sun for longer periods. That is, the sharp bend in the mounting post 600 helps create additional space below the reflectors so that a bottom portion of the reflectors is not blocked by the mounting post when the reflectors are tilted far to one side. In some embodiments, the mounting post 600 is arranged to allow the reflectors of the collector row to tilt up to at least ±75° (i.e., for a total range of motion of 170°) around a pivot axis without coming in contact with the mounting post, although larger and smaller tilt angles are also possible. By way of example, a range of tilt angles of up to at least ±70°, ±80° or ±85° around the pivot axis works well for various applications. It should also be appreciated that the range of motion need not be symmetric. Some implementations involve reflectors whose maximum tilt angle in one direction around the pivot axis is approximately 5° to 20° greater than in the opposing direction (e.g., a reflector whose tilt range is up to at least +85° and −70°.) In still other embodiments, the aforementioned ranges are achievable at least in part by appropriately arranging the support structure underneath the reflectors. For example, some implementations involve lowering the tube assembly 120 and/or the pivot axis 122 relative to the overlying reflectors 110 of FIG. 2B so that the reflectors 110 have more room to tilt without being blocked by the underlying mounting post.

Although only a few embodiments of the invention have been described in detail, it should be appreciated that the invention may be implemented in many other forms without departing from the spirit or scope of the invention. By way of example, some of the figures relate to a collector design involving dual trough reflectors and receivers in a particular arrangement. However, it should be appreciated that the collector rows, coupling devices, coupling arrangements, mounting posts and any other feature described in this application may also be applied to a wide assortment of collector designs i.e., almost any suitable collector design that tracks the sun in at least one dimension, almost any suitable collector that can be arranged side by side with other collectors along a longitudinal axis, etc. Although various drawings and descriptions in this application are quite detailed in explaining how various components interface and interact, it should be noted that the present invention contemplates modifying these embodiments to suit a variety of applications. For example, it should be appreciated that the present invention contemplates non-drive coupling devices 400 of FIG. 4A without the illustrated transfer arms 404, and also contemplates drive coupling devices 300 of FIG. 3A without a coupler 304 or a mounting plate 310. It should be further noted that any component of one figure may be replaced or modified using a corresponding component that is described herein. For example, any of the mounting posts 104 of FIG. 1 may be replaced or modified using the mounting post 600 of FIG. 6. Additionally, any of the coupling devices used to connect the tube assemblies of collectors 102a-102d in FIG. 1 may be replaced with any of the coupling devices described herein. The foregoing description sometimes refers to forming a substantially continuous flux line. It is noted that the present application contemplates various definitions of the term, "flux line," and various ways of forming a substantially continuous flux line on the photovoltaic cells of a solar receiver. Some of these definitions and approaches are described, for example, in patent application Ser. No. 12/728,149, entitled "Reflective Surface for Solar Energy Collector," filed Mar. 19, 2010, which is incorporated herein in its entirety for all purposes. Therefore, the present embodiments should be considered as illustrative and not restrictive and the invention is not limited to the details given herein, but may be modified within the scope and equivalents of the appended claims.

What is claimed is:

1. A solar energy collection system that includes a collector row that extends along a longitudinal axis and tracks the sun in at least one dimension by rotating about a pivot axis, the solar energy collection system comprising:
    a plurality of longitudinally adjacent collectors that are coupled end to end along the longitudinal axis to form the collector row, the collector row including at least adjacent first and second collectors, each collector comprising:
        a reflector;
        at least one solar receiver, each solar receiver including at least one photovoltaic cell; and
        a support structure that supports the at least one receiver and the reflector; and
    a drive coupling device that connects the adjacent first and second collectors, the drive coupling device including a motor and being arranged to apply rotational torque to help rotate the reflectors of the adjacent first and second collectors, wherein substantially the entire motor is configured to rotate substantially in tandem with the reflectors of the first and second collectors.

2. A solar energy collection system as recited in claim 1, wherein:
    the plurality of longitudinally adjacent collectors includes a first collector and a second collector that are arranged adjacent to one another; and
    the drive coupling device further includes a slew drive that is coupled with and driven by the motor, the slew drive arranged to apply rotational torque to the support structures of the adjacent first and second collectors.

3. A solar energy collection system as recited in claim 2, wherein the slew drive includes a stationary portion and a rotatable portion, the rotatable portion being coupled to and arranged to rotate the support structures of the adjacent first and second collectors.

4. A solar energy collection system as recited in claim 3, further comprising a mounting post that supports the drive coupling device, the mounting post including a bottom end and a top end, wherein the bottom end of the mounting post is mounted on the ground and the top end of the mounting post is attached with the stationary portion of the slew drive.

5. A solar energy collection system as recited in claim 2, further comprising a planetary drive that is coupled with the motor and the slew drive, the planetary drive arranged to reduce the rotational speed of the motor to a speed appropriate for driving the collector row.

6. A solar energy collection system as recited in claim 2, wherein the plurality of collectors further includes a third collector, the solar energy collection system further comprising:
    a non-drive coupling device that couples the support structure of the third collector with the support structure of the first collector to extend the collector row in the longitudinal direction, the non-drive coupling device arranged to transfer rotational torque from the rotation of the support structure of the first collector to the support structure of the third collector.

7. A solar energy collection system as recited in claim 6, wherein the non-drive coupling device includes a transfer arm that helps connect the support structures of the first and third collectors, the transfer arm including one or more flexible portions that allow the transfer arm to move in the longitudinal direction to help compensate for differential thermal expansion along the length of the collector row.

8. A solar energy collection system as recited in claim 1, wherein the drive coupling device includes at least one alignment feature that is arranged to help hold together the drive coupling device and the support structures of the first and second adjacent collectors without use of welding.

9. A solar energy collection system as recited in claim 8, wherein each alignment feature includes an alignment hole and a precision dowel that is arranged to fit through the alignment hole to help secure portions of the drive coupling device to portions of the adjacent first and second collectors.

10. A solar energy collection system as recited in claim 1, wherein:
no part of the support structure of each collector extends longitudinally beyond the reflector of the collector; and
neither the support structure nor the at least one solar receiver of each collector are positioned in front of an optical aperture of the reflector.

11. A solar energy collection system as recited in claim 1, wherein the drive coupling device includes a rotatable portion that is directly attached to, supports and carries the motor, thereby causing the motor to rotate together with the rotatable portion.

12. A solar energy collection system that includes a collector row that extends along a longitudinal axis and tracks the sun in at least one dimension by rotating about a pivot axis, the solar energy collection system comprising:
a plurality of longitudinally adjacent collectors including first, second and third collectors that are coupled end to end along the longitudinal axis to form a collector row, each collector comprising:
a reflector;
at least one receiver, each solar receiver including at least one photovoltaic cell; and
a support structure that supports the at least one receiver and the reflector, there being a space between the support structures of adjacent collectors in the collector row, wherein the reflectors of the adjacent collectors extend beyond the underlying support structures to form a substantially continuous reflective surface over the space such that a gap between the reflectors of the adjacent collectors is less than approximately 10 millimeters;
a drive coupling device that is positioned between the support structures of the adjacent first and second collectors, the drive coupling device including a motor and a slew drive that is coupled with and driven by the motor, the slew drive being attached with and arranged to rotate the support structures and reflectors of the first and second collectors, wherein the motor is supported and carried by the slew drive such that the motor is configured to rotate substantially in tandem with the support structures of the first and second collectors; and
a non-drive coupling device that couples the support structure of the third collector with the support structure of the first collector to extend the collector row in the longitudinal direction, wherein the non-drive coupling device is arranged to transfer rotational torque from the rotation of the support structure of the first collector to the support structure of the third collector.

13. A solar energy collection system as recited in claim 12, wherein:
the solar receivers of the adjacent collectors are arranged along the longitudinal axis to form a solar receiver row; and
the substantially continuous reflective surface formed by the reflectors of the adjacent collectors is arranged to reflect light towards the photovoltaic cell string to help form a substantially continuous flux line that extends along the photovoltaic cells of the entire solar receiver row.

14. A solar energy collection system as recited in claim 12, wherein the drive coupling device includes at least one alignment feature that is arranged to help hold together the drive coupling device and the support structures of the first and second adjacent collectors without use of welding.

\* \* \* \* \*